(12) United States Patent  
Iwata

(10) Patent No.: US 11,817,464 B2  
(45) Date of Patent: Nov. 14, 2023

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventor: Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 324 days.

(21) Appl. No.: 16/992,758

(22) Filed: Aug. 13, 2020

(65) Prior Publication Data  
US 2021/0057463 A1 Feb. 25, 2021

(30) Foreign Application Priority Data  
Aug. 23, 2019 (JP) .................. 2019-153101

(51) Int. Cl.  
*H01L 27/144* (2006.01)  
*H01L 31/02* (2006.01)  
(Continued)

(52) U.S. Cl.  
CPC ............ *H01L 27/1446* (2013.01); *G01J 1/44* (2013.01); *G01S 17/08* (2013.01); *G01S 17/931* (2020.01); *H01L 31/02027* (2013.01); *H01L 31/022408* (2013.01); *H01L 31/107* (2013.01); *G01J 2001/442* (2013.01); *G01J 2001/4466* (2013.01)

(58) Field of Classification Search  
CPC ........... H01L 27/1446; H01L 31/02027; H01L 31/022408; H01L 31/107; G01J 2001/442; G01J 2001/4466; G01S 17/931; G01S 17/08  
See application file for complete search history.

(56) References Cited

U.S. PATENT DOCUMENTS 7,825,384 B1 * 11/2010 Saveliev ............. H01L 27/1446  
250/370.01  
9,881,963 B1 * 1/2018 Chen ................... H01L 27/1463  
(Continued)

FOREIGN PATENT DOCUMENTS

EP 3545559 A1 10/2019  
JP 2010-536187 A 11/2010  
(Continued)

*Primary Examiner* — Georgia Y Epps  
*Assistant Examiner* — Don J Williams  
(74) *Attorney, Agent, or Firm* — CANON U.S.A., INC. IP Division

(57) ABSTRACT

A photoelectric conversion apparatus includes a semiconductor substrate, a plurality of avalanche diodes formed within the semiconductor substrate, the plurality of avalanche diodes including a first avalanche diode and a second avalanche diode, and a trench structure formed between the first avalanche diode and the second avalanche diode in a plan view. Each of the avalanche diodes includes a first semiconductor region of a first conductivity type and a second semiconductor region of a second conductivity type. A contact plug for supplying a potential to the second semiconductor region of the first avalanche diode is formed, and the contact plug is provided at a position where the contact plug overlaps with the trench structure in a plan view.

14 Claims, 15 Drawing Sheets

(51) Int. Cl.
  *H01L 31/0224* (2006.01)
  *H01L 31/107* (2006.01)
  *G01S 17/08* (2006.01)
  *G01J 1/44* (2006.01)
  *G01S 17/931* (2020.01)

(56) References Cited

U.S. PATENT DOCUMENTS

| | | |
|---|---|---|
| 10,204,950 B1 | 2/2019 | Yamashita |
| 2015/0200222 A1* | 7/2015 | Webster ............... H01L 31/107 |
| | | 250/208.1 |
| 2018/0210069 A1* | 7/2018 | Mase ...................... G01S 17/10 |
| 2018/0270405 A1 | 9/2018 | Ota |

FOREIGN PATENT DOCUMENTS

| | | |
|---|---|---|
| JP | 2018-201005 A | 12/2018 |
| JP | 2019-33136 A | 2/2019 |
| JP | 2020-150002 A | 9/2020 |

* cited by examiner

FRONT VIEW

TOP VIEW

REAR VIEW

PHOTOELECTRIC CONVERSION APPARATUS, PHOTOELECTRIC CONVERSION SYSTEM, AND MOVING BODY

BACKGROUND

Field

The present disclosure relates to a photoelectric conversion apparatus, a photoelectric conversion system, and a moving body.

Description of the Related Art

A photoelectric conversion apparatus having a configuration in which the number of photons arriving at a light-receiving portion is counted in a digital manner and the counted value is output as a digital signal from a pixel is known. Japanese Patent Application Laid-Open No. 2018-201005 discusses a photodetector which uses avalanche diodes that cause an avalanche multiplication in a pn-junction region of a semiconductor region constituting a photoelectric conversion unit. In the photodetector discussed in Japanese Patent Application Laid-Open No. 2018-201005, a trench structure is arranged between adjacent avalanche diodes. Further, in the photodetector discussed in Japanese Patent Application Laid-Open No. 2018-201005, a contact for supplying a potential to each avalanche diode is arranged between the avalanche diode and the trench structure in a plan view.

The photodetector discussed in Japanese Patent Application Laid-Open No. 2018-201005 is capable of reducing crosstalk in which a signal read out to one avalanche diode by the trench structure propagates to another avalanche diode. However, as the size of each pixel is reduced, a distance between a contact plug and an N-type semiconductor region constituting each avalanche diode decreases. If a potential is supplied to each avalanche diode in this state, a locally high electric field region is formed and thus a dark current is likely to be generated.

SUMMARY

According to an aspect of the present disclosure, a photoelectric conversion apparatus includes a semiconductor substrate including a first surface, a plurality of avalanche diodes formed within the semiconductor substrate, the plurality of avalanche diodes including a first avalanche diode and a second avalanche diode, and a trench structure formed between the first avalanche diode and the second avalanche diode in a plan view. Each of the plurality of avalanche diodes includes a first semiconductor region of a first conductivity type formed at a first depth, and a second semiconductor region of a second conductivity type formed at a second depth which is deeper than the first depth from the first surface. A contact plug configured to supply a potential to the second semiconductor region of the first avalanche diode is formed on the first surface, and the contact plug is provided at a position where the contact plug overlaps with the trench structure in a plan view.

Further features of the present disclosure will become apparent from the following description of exemplary embodiments with reference to the attached drawings.

DESCRIPTION OF THE EMBODIMENTS

Figure 1:
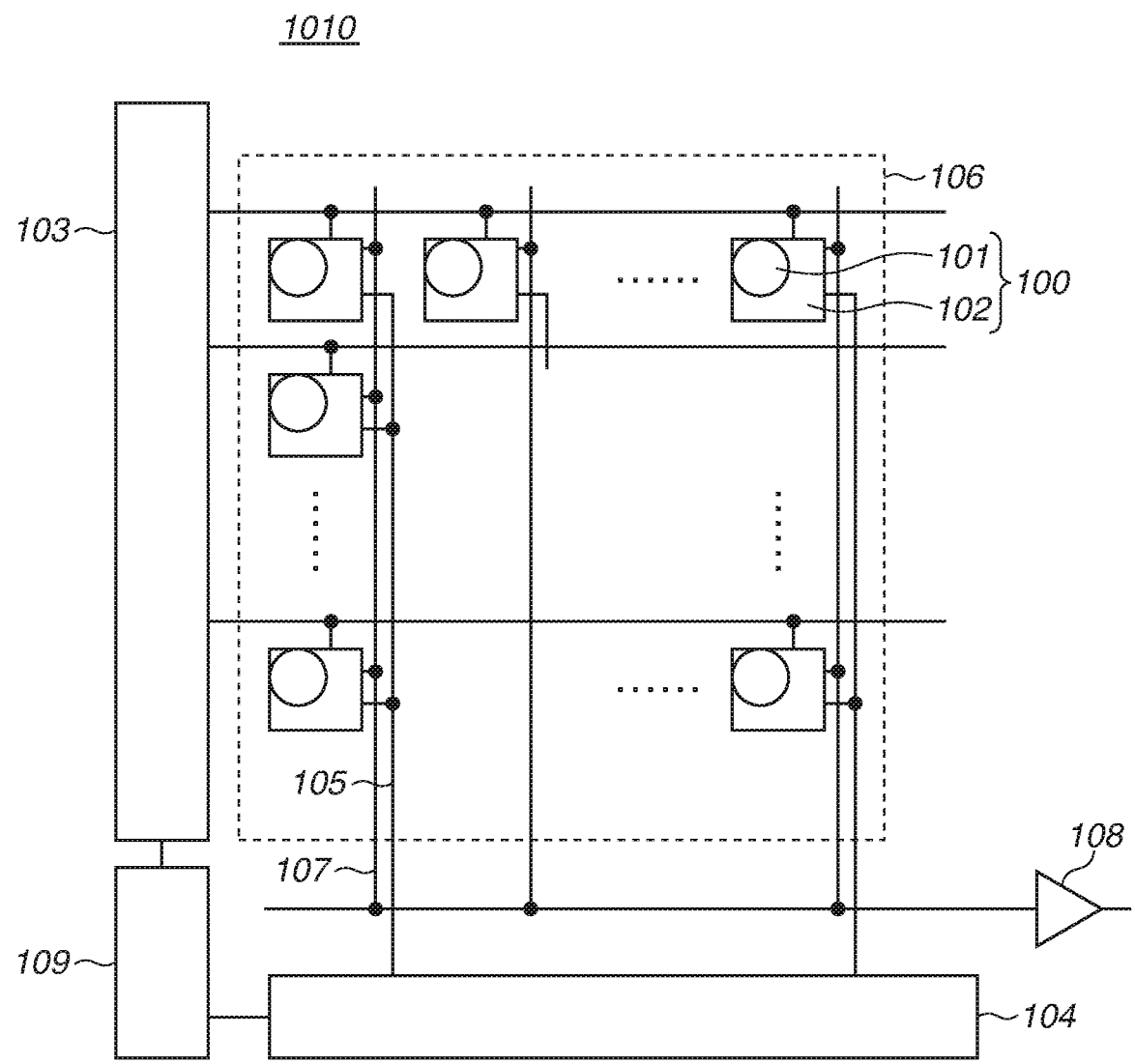
FIG. 1 is a block diagram illustrating a photoelectric conversion apparatus according to an exemplary embodiment of the present disclosure.

The following exemplary embodiments are merely examples embodying the technical idea of the present disclosure, and are not intended to limit the present disclosure. The sizes of members illustrated in the drawings and positional relationships among the members may be exaggerated for clarity of description. In the following description, the same components are denoted by the same reference numerals, and descriptions thereof may be omitted.

The following exemplary embodiment particularly relates to a photoelectric conversion apparatus including single photon avalanche diodes (SPAD) that count the number of photons incident on the avalanche diodes. The photoelectric conversion apparatus includes at least avalanche diodes.

In the following description, a potential at an anode of each avalanche diode is a fixed potential and a signal is taken out from a cathode of the avalanche diode. Accordingly, a semiconductor region of a first conductivity type in which carriers having the same conductivity type as that of signal carriers are used as major carriers is an N-type semiconductor region. A semiconductor region of a second conductivity type is a P-type semiconductor region. The present disclosure can be applied also when the potential at the cathode of each avalanche diode is a fixed potential and light is taken out from the anode of the avalanche diode. In this case, the semiconductor region of the first conductivity type in which carriers having the same conductivity type as that of signal carriers are used as major carriers is a P-type semiconductor region, and the semiconductor region of the second conductivity type is an N-type semiconductor region.

FIG. 1 is a block diagram illustrating a photoelectric conversion apparatus 1010 according to the present exemplary embodiment. The photoelectric conversion apparatus 1010 includes a pixel unit 106, a control pulse generation unit 109, a horizontal scanning circuit unit 104, control lines 105, signal lines 107, a vertical scanning circuit unit 103, and an output circuit 108.

A plurality of pixels 100 is two-dimensionally arranged in the pixel unit 106. Each pixel 100 is composed of a photoelectric conversion unit 101 and a pixel signal processing unit 102. The photoelectric conversion unit 101 converts light into an electric signal. The pixel signal processing unit 102 outputs the converted electric signal to the output circuit 108.

The vertical scanning circuit unit 103 and the horizontal scanning circuit unit 104 receive a control pulse supplied from the control pulse generation unit 109 and supply each pixel 100 with the control pulse. As the vertical scanning circuit unit 103, a logic circuit such as a shift register or and an address decoder is used.

Each signal line 107 supplies a subsequent-stage circuit of each pixel 100 with the signal output from the pixel 100 selected by the vertical scanning circuit unit 103 as a potential signal.

The output circuit 108 is composed of a buffer amplifier, a differential amplifier, or the like, and outputs signals output from each pixel 100 to an external recording unit or a signal processing unit of the photoelectric conversion apparatus 1010.

In the configuration illustrated in FIG. 1, the pixels 100 may be one-dimensionally arranged in the pixel unit 106. A plurality of pixel rows in the pixel unit 106 may be divided into blocks, and the vertical scanning circuit unit 103 and the horizontal scanning circuit unit 104 may be arranged in each block. Alternatively, the vertical scanning circuit unit 103 and the horizontal scanning circuit unit 104 may be arranged in each pixel row.

The function of the pixel signal processing unit 102 is not necessarily provided in all the pixels 100. For example, a single pixel processing unit 102 may be shared by a plurality of pixels 100 to sequentially perform signal processing. Further, the pixel signal processing unit 102 may be provided on a semiconductor substrate different from that of the photoelectric conversion unit 101 to increase the aperture ratio of the photoelectric conversion unit 101. In this case, the photoelectric conversion unit 101 and the pixel signal processing unit 102 are electrically connected via a connection wire provided for each pixel. The vertical scanning circuit unit 103, the horizontal scanning circuit unit 104, and the signal line 107 may also be provided on different semiconductor substrates, respectively, as described above.

Figure 2:
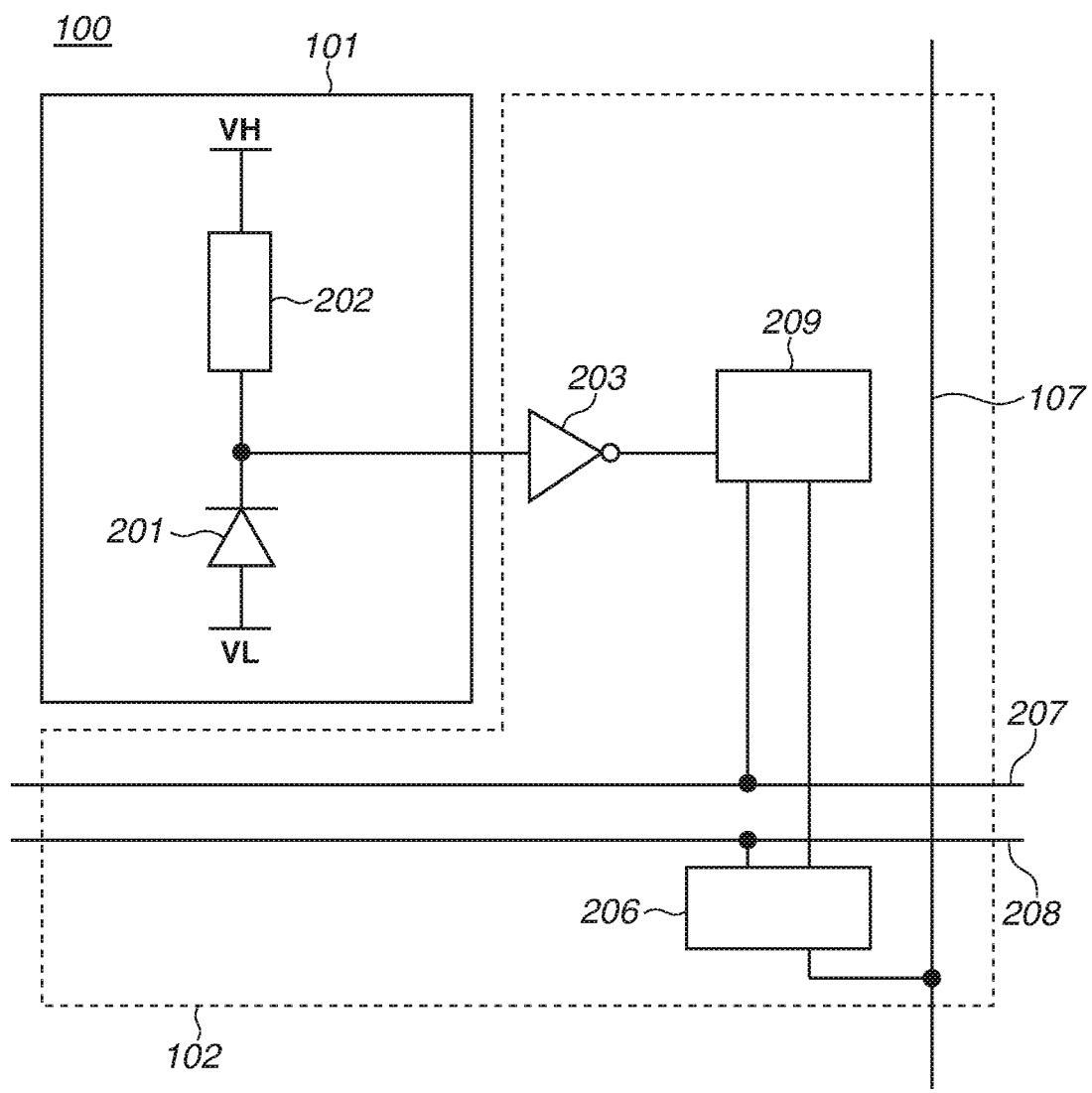
FIG. 2 is a block diagram illustrating a pixel.

FIG. 2 is a block diagram illustrating a single pixel 100 including an equivalent circuit according to the present exemplary embodiment. Referring to FIG. 2, a single pixel 100 includes the photoelectric conversion unit 101 and the pixel signal processing unit 102. The photoelectric conversion unit 101 includes an avalanche diode 201 and a quench element 202. The avalanche diode 201 generates an electric charge pair based on incident light, by photoelectric conversion. A cathode of the avalanche diode 201 is supplied with a potential based on a potential VH that is higher than a potential VL to be supplied to an anode of the avalanche diode 201. Each of the anode and the cathode of the avalanche diode 201 is supplied with a potential such that a reverse bias is applied which multiplies photons incident on the avalanche diode 201 by avalanche multiplication. When photoelectric conversion is performed in a state where the potential of the reverse bias is supplied as described above, electric charges generated by incident light cause an avalanche multiplication, thereby generating an avalanche current.

In the case of supplying the potential of the reverse bias, if a potential difference between the anode and the cathode is greater than a breakdown voltage, the avalanche diode operates in a Geiger mode. The avalanche diode that detects a small signal of a single photon level at a high speed by using a Geiger mode operation is referred to as a single photon avalanche diode (SPAD).

The quench element 202 is connected to each of the avalanche diode 201 and a power supply for supplying the high potential VH. The quench element 202 is composed of a P-type metal-oxide semiconductor (MOS) transistor or a resistive element such as a diffused resistor. When an optical current is multiplied by avalanche multiplication in the avalanche diode 201, a current obtained by multiplied signal charges flows to a connection node between the avalanche diode 201 and the quench element 202. Due to a voltage drop caused by the current, the potential at the cathode of the avalanche diode 201 decreases, and the avalanche diode 201 stops forming an avalanche. Thus, the avalanche multiplication of the avalanche diode 201 is stopped. After that, the potential VH of the power supply is supplied to the cathode of the avalanche diode 201 through the quench element 202, and thus the potential to be supplied to the cathode of the avalanche diode 201 is returned to the potential VH. In other words, an operation region of the avalanche diode 201 is brought into the Geiger mode operation again. Thus, the quench element 202 functions as a load circuit (quench circuit) during signal amplification by avalanche multiplication, and has a function of suppressing the avalanche multiplication (quench operation). Further, the quench element has a function of bringing the operation region of the avalanche diode 201 into the Geiger mode again after suppressing the avalanche multiplication.

The pixel signal processing unit 102 includes a waveform shaping unit 203, a counter circuit 209, and a selection circuit 206. The waveform shaping unit 203 shapes a variation in the potential at the cathode of the avalanche diode 201 that is obtained at the time of detection of photons, and outputs a pulse signal. As the waveform shaping unit 203, for example, an inverter circuit is used. While the present exemplary embodiment illustrates an example where a single inverter is used as the waveform shaping unit 203, a circuit in which a plurality of inverters is connected in series may be used, or other circuits having a waveform shaping effect may also be used.

The pulse signal output from the waveform shaping unit 203 is counted by the counter circuit 209. For example, in the case of using an N-bit counter (N: a positive integer), the counter circuit 209 can count the pulse signal of a single photon up to the N-th power of about 2 at the maximum. The counted signal is held as the detected signal. Further, when a control pulse pRES is supplied through a control line 105 (shown in FIG. 1), the signal held in the counter circuit 209 is reset.

The selection circuit 206 is supplied with the control pulse pSEL from the vertical scanning circuit unit 103 illustrated in FIG. 1 through the corresponding control line 208 illustrated in FIG. 2, and switches the electrical connection and disconnection between the counter circuit 209 and the signal line 107. The selection circuit 206 includes, for example, a buffer circuit for outputting a signal.

A switch, such as a transistor, may be provided between the quench element 202 and the avalanche diode 201 or between the photoelectric conversion unit 101 and the pixel signal processing unit 102 to switch the electrical connection. Similarly, the supply of the high potential VH or the low potential VL to the avalanche diode 201 may be electrically switched over by a switch such as a transistor.

In the pixel unit 106 in which the plurality of pixels 100 is arranged in a matrix form, a captured image may be acquired by a rolling shutter operation in which counting of the counter circuit 209 is sequentially reset for each row and the signals held in the counter circuit 209 are sequentially output for each row.

Alternatively, a captured image may be acquired by a global electronic shutter operation in which counting of the counter circuit 209 in all pixel rows is reset simultaneously and the signals held in the counter circuit 209 are sequentially output for each row. When the global electronic shutter operation is performed, it is preferable that a unit for switching the counter circuit 209 is provided between a counting operation and a non-counting operation. The unit for switching is, for example, the switch described above.

The present exemplary embodiment illustrates a configuration in which a captured image is acquired using the counter circuit 209. However, instead of using the counter circuit 209, the photoelectric conversion apparatus 1010 may be used that acquires a pulse detection timing using a time-to-digital converter (TDC) and a memory.

In this case, the generation timing of the pulse signal output from the waveform shaping unit 203 is converted into a digital signal by the TDC. A control pulse pREF (reference signal) is supplied to the TDC from the vertical scanning circuit unit 103 illustrated in FIG. 1 through a drive line to measure the timing of the pulse signal. Based on the control pulse pREF, the TDC acquires, as a digital signal, a signal obtained when the input timing of the signal output from each pixel 100 through the waveform shaping unit 203 is set as a relative time.

A configuration of a photoelectric conversion apparatus according to a first exemplary embodiment will be described with reference to FIGS. 3 to 7B.

Figure 3:
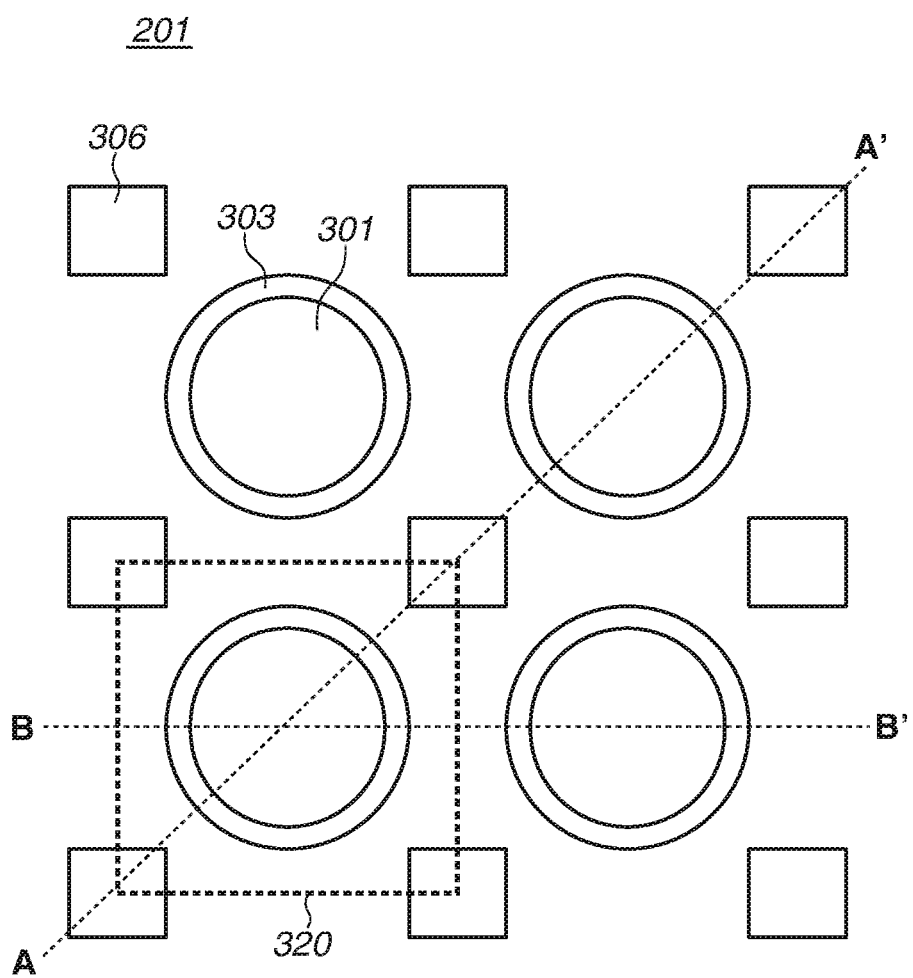
FIG. 3 is a plan view at a first depth according to a first exemplary embodiment.
Figure 4:
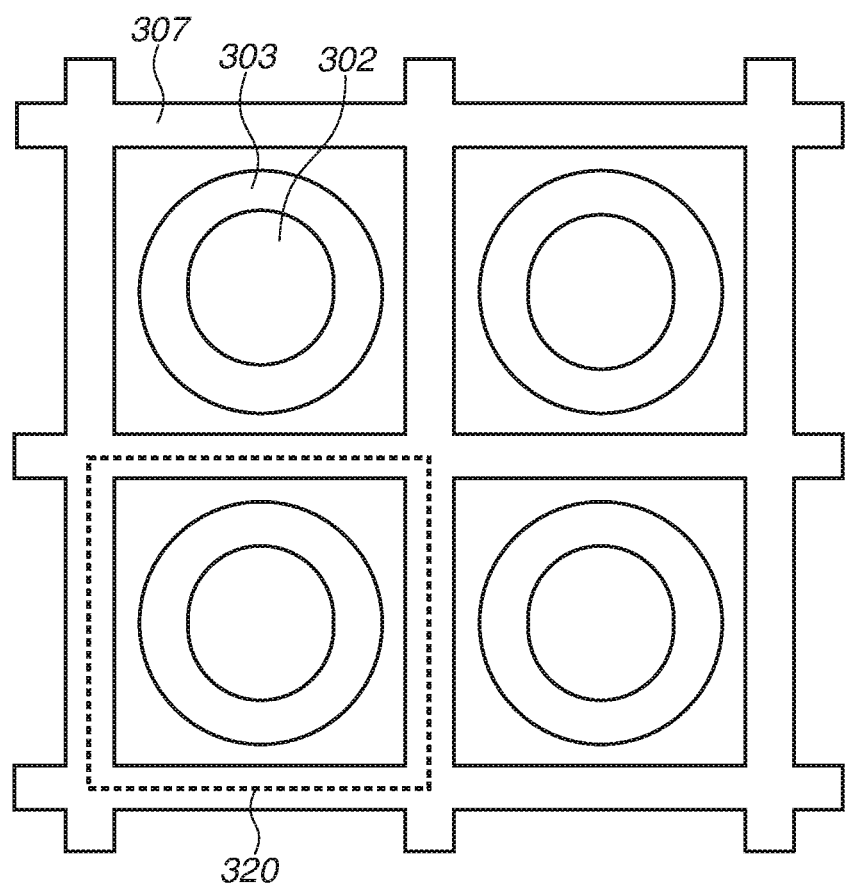
FIG. 4 is a plan view at a second depth according to the first exemplary embodiment.
Figure 5:
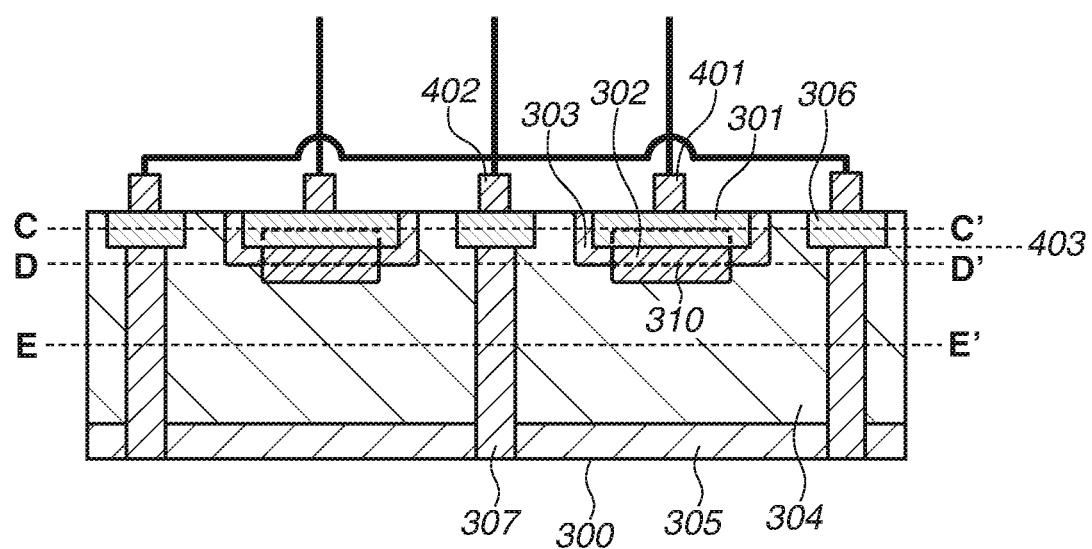
FIG. 5 is a sectional view taken along a line A-A' in FIG. 3.
Figure 6:
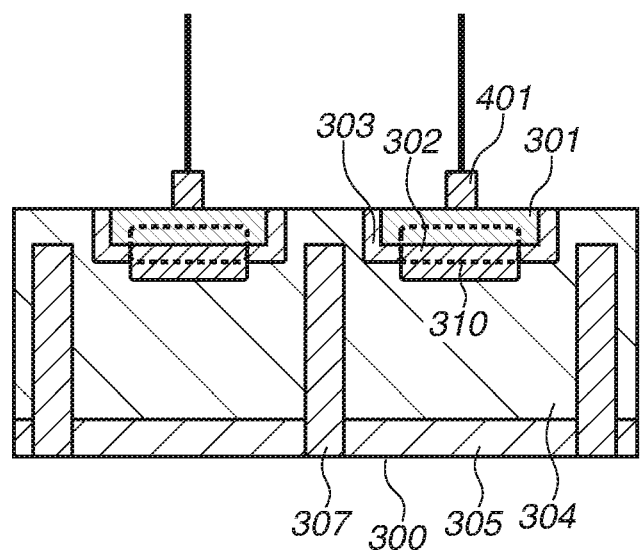
FIG. 6 is a sectional view taken along a line B-B' in FIG. 3.
Figure 7B:
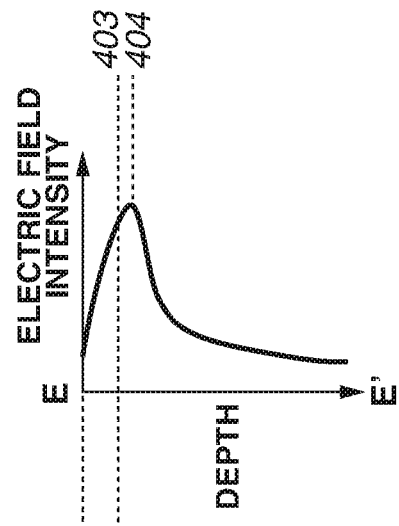
FIGS. 7A and 7B each illustrate an electric field intensity distribution according to the first exemplary embodiment.

FIG. 3 is a schematic sectional view taken along a line C-C' in FIG. 5. FIG. 4 is a schematic sectional view taken along a line D-D' in FIG. 5. FIG. 3 illustrates that four pixels include two pixels arranged in a first direction and two pixels arranged in a second direction perpendicular to the first direction in a plan view. The first direction refers to a direction along a pixel row (row direction). In other words, the first direction is a direction in which there is a plurality of pixels in a first row, and the direction is provided from one end to the other end. The second direction refers to a direction along a pixel column (column direction). FIG. 5 is a schematic sectional view taken along a line A-A' in FIG. 3. FIG. 6 is a schematic sectional view taken along a line B-B' in FIG. 3. FIG. 7B is a graph illustrating an electric field intensity distribution illustrated in FIG. 7A.

As illustrated in FIG. 5, each avalanche diode is formed within a semiconductor substrate 300. The semiconductor substrate 300 includes a first surface and a second surface that faces the first surface. The first surface is a side surface on which contact plugs 401 and 402 are formed. On the first surface, a gate electrode of each transistor and a multi-layer wiring structure are arranged. Light is incident from the second surface of the semiconductor substrate 300.

Each avalanche diode includes at least a first semiconductor region 301, which is of the first conductivity type and formed at a first depth, and a second semiconductor region 302 which is of the second conductivity type and formed at a second depth deeper than the first depth from the first surface. The first semiconductor region 301 and the second semiconductor region 302 form a pn-junction. The second semiconductor region 302 is supplied with a potential through a third semiconductor region 306 of the second conductivity type. The term "depth" used herein refers to a depth running from the first surface to the second surface. In the configuration illustrated in FIG. 5, the first depth is a depth indicated by the line C-C', the second depth is a depth indicated by the line D-D', and a third depth is a depth indicated by a line E-E'.

In the configuration illustrated in FIG. 5, each avalanche diode further includes a sixth semiconductor region 303 which is of the first conductivity type and is arranged around the first semiconductor region 301 in a plan view. The sixth semiconductor region 303 is arranged to cover corner portions of the first semiconductor region 301. In other words, the sixth semiconductor region 303 is continuously formed in a range from a side surface of the first semiconductor region 301 to a part of a lower surface of the first semiconductor region 301. The formation of the sixth semiconductor region 303 makes it possible to ease up the electric field concentration.

An impurity concentration of the sixth semiconductor region 303 is lower than an impurity concentration of the first semiconductor region 301. For example, when the impurity concentration of the first semiconductor region 301 is $6.0 \times 10^{18}$ [atms/cm$^3$] or more, the impurity concentration of the sixth semiconductor region 303 is in a range from $1.0 \times 10^{16}$ [atms/cm$^3$] to $1.0 \times 10^{18}$ [atms/cm$^3$].

Each avalanche diode further includes a fourth semiconductor region 304 of the second conductivity type and a fifth semiconductor region 305 of the second conductivity type. The fourth semiconductor region 304 and the fifth semiconductor region 305 are formed at the third depth which is deeper than the second depth from the first surface. The impurity concentration of the fifth semiconductor region 305 is preferably higher than the impurity concentration of the fourth semiconductor region 304. With this configuration, signal charges generated in the fourth semiconductor region 304 can be easily collected on the first surface of the semiconductor substrate 300.

At the first depth, the third semiconductor region 306 of the second conductivity type is arranged between the first semiconductor region 301 of the first avalanche diode included in a first pixel and the first semiconductor region 301 of the second avalanche diode included in a second pixel. As illustrated in FIG. 3, the third semiconductor region 306 is arranged between avalanche diodes in a diagonal direction in a plan view. The diagonal direction refers to, for example, a direction crossing the row direction and the column direction.

As illustrated in FIG. 5, the contact plug (electrode) 402 is connected to the third semiconductor region 306. The third semiconductor region 306 is supplied with a predetermined potential through the electrode 402. The fourth semiconductor region 304 is in contact with the third semiconductor region 306, and the second semiconductor region 302 is in contact with the fourth semiconductor region 304. Accordingly, the potential to be applied to the third semiconductor region 306 is supplied to the second semiconductor region 302 through the fourth semiconductor region 304.

The electrode 402 is preferably arranged between avalanche diodes in the diagonal direction. Specifically, the electrode 402 is preferably arranged at an intersection between portions of a trench structure to be described below. Further, the third semiconductor region 306 is preferably arranged between a trench structure 307 and the electrode 402. A distance between avalanche diodes in the diagonal direction is likely to be longer than a distance between avalanche diodes in the row direction. By arranging the electrode 402 and the third semiconductor 306 in the region in which the distance tends to increase, the first semiconductor region 301 and the third semiconductor region 306 can be hindered from being located extremely close to each other even when the size of each pixel is reduced.

The contact plug (electrode) 401 is connected to the first semiconductor region 301. The electrodes 402 and 401 are supplied with a potential such that an electric field sufficient to cause an avalanche multiplication is applied to an avalanche multiplication region 310. At that time, the electrode 401 supplies the electrode 402 with a potential as a reverse bias. Specifically, a potential difference between the first semiconductor region 301 and the second semiconductor region 302 is in a range from 6 V to 30 V. For example, the first semiconductor region 301 is supplied with a potential of 6 V or more, and the second semiconductor region 302 is supplied with a potential of 0 V or less. However, the potential values are not particularly limited as long as the potential difference is 6 V or more.

Further, a depletion layer at the pn-junction formed by the first semiconductor region 301 and the second semiconductor region 302 depletes the entire first semiconductor region 301. When the depletion layer contacts the first surface, a dark current is likely to be generated at an interface between the semiconductor substrate 300 and a wiring layer. Accordingly, the impurity concentration of the first semiconductor region 301 is preferably set so as to prevent the entire first semiconductor region 301 from being depleted.

The trench structure 307 is arranged between the third semiconductor region 306 and the second surface of the semiconductor substrate 300. In other words, the trench structure 307 is arranged at a position where the trench structure 307 overlaps with the electrode 402 in a plan view. The configuration makes it possible to suppress an increase in dark current while reducing crosstalk between adjacent avalanche diodes. This configuration will be described in detail below.

As a comparative example, a case will be considered where a trench structure is formed between adjacent avalanche diodes, and a contact plug is formed between the trench structure and a pn-junction of an avalanche diode in a plan view. Even in the comparative example, it is possible to prevent electric charges generated in one avalanche diode by the trench structure from propagating to another avalanche diode. However, if the size of each pixel is to be reduced, the distance between the pn-junction portion of the avalanche diode and the contact plug is reduced. The third semiconductor region is disposed in consideration of the production tolerance of the position where the plug is formed. Accordingly, the third semiconductor region is disposed at a position closer to the first semiconductor region than the position where the contact plug is formed. As shown in the comparative example, in the case where the contact plug is formed at a position deviating from the trench structure, when the size of each pixel is reduced, a high electric field is likely to be applied between the first semiconductor region and the third semiconductor region to which the contact plug is connected. Further, the avalanche multiplication is likely to occur in a region in which the avalanche multiplication is preferably prevented from occurring. Accordingly, if the contact plug and the trench structure do not overlap with each other in a plan view, the size of each pixel cannot be easily reduced. On the other hand, according to the present exemplary embodiment, the trench structure and the contact plug overlap with each other in a plan view, and a semiconductor region for supplying a potential to each avalanche diode is arranged between the contact plug and the trench structure. The configuration makes it possible to reduce crosstalk between adjacent avalanche diodes and to reduce the size of each pixel while suppressing an increase in dark current.

The trench structure 307 preferably includes a material different from the semiconductor substrate 300. For example, the trench structure 307 includes an insulating member, air, and metal. In a case where the semiconductor substrate 300 is made of silicon, the insulating member is a silicon oxide or silicon nitride, for example. This configuration makes it possible to reduce crosstalk between adjacent avalanche diodes. More preferably, the trench structure 307 includes at least one of an insulating member and metal. In the avalanche multiplication region 310, light may be emitted. This seems to be caused by photons which are generated when electrons generated as hot carriers by avalanche multiplication are recombined with holes. When the photons generated due to the avalanche emission leak into adjacent pixels and are photoelectrically converted, pairs of an electron and a hole are generated. In other words, the photons generated not by the incident light but by the avalanche emission are read out as signals from adjacent pixels, thereby a pseudo signal is obtained. If the trench structure 307 includes a light-shielding member such as metal, intrusion of the photons into adjacent pixels can be prevented even if the avalanche emission occurs.

One end 403 that is located close to the first surface of the semiconductor substrate 300 of the trench structure 307 is preferably formed at a height corresponding to a value of the distance between the second semiconductor region 302 and the first surface, and is preferably formed to reach a side closer to the first surface than the avalanche multiplication region 310. The avalanche multiplication region 310 is located in the vicinity of a pn-junction surface between the first semiconductor region 301 and the second semiconductor region 302. The one end 403 and the pn-junction surface between the first semiconductor region 301 and the second semiconductor region 302 are preferably located on a plane parallel to the first surface of the semiconductor substrate 300 or at a position shallower than that plane. This configuration is preferably used to reduce crosstalk caused by a luminous phenomenon in the avalanche multiplication region 310. The light emission phenomenon in the avalanche multiplication region 310 occurs in a high electric field region, i.e., in the vicinity of the pn-junction surface between the first semiconductor region 301 and the second semiconductor region 302. Therefore, the light emission phenomenon during avalanche multiplication is caused on the first surface of the semiconductor substrate in the second semiconductor region 302. Accordingly, the one end 403 of the trench structure 307 is preferably formed at a position that is closer to the first surface of the semiconductor substrate than the depth at which the second semiconductor region 302 is formed. Specifically, the one end 403 of the trench structure 307 is preferably formed from the second surface to the same depth as a lower end of the first semiconductor region 301, and is further preferably formed to a depth that is deeper than the first surface and is shallower than the lower end of the first semiconductor region 301. Among the photons emitted in the avalanche multiplication region 310, a small number of photons pass through the space between the first surface of the semiconductor substrate and the one end 403 of the trench structure 307 and leak into adjacent pixels. However, even when the photons intruding in this way are photoelectrically converted in adjacent pixels, the photons are not multiplied by avalanche multiplication sufficiently enough to count the photons as signals from the avalanche diodes, and thus the photons are not counted as the crosstalk between adjacent pixels.

The trench structure 307 is preferably arranged around the first semiconductor region 301 in a plan view. With this configuration, the crosstalk components are hindered from leaking into adjacent pixels. Referring to FIG. 4, the trench structure 307 includes a first portion extending in the first direction, and a second portion extending in a direction crossing the first direction. As described above, the third semiconductor region 306 is arranged at the position where the third semiconductor region 306 overlaps with the intersection between the first portion and the second portion of the trench structure 307 in a plan view.

The width of the trench structure 307 is smaller than the width of the third semiconductor region 306. With this configuration, the crosstalk can be reduced without reducing a sensitivity region.

Figure 7A:
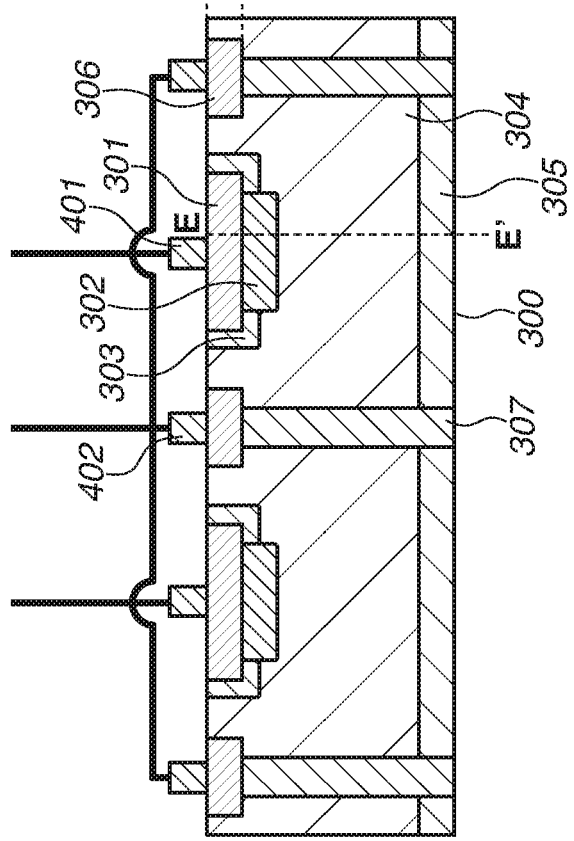

FIGS. 7A and 7B each illustrate an electric field intensity distribution. FIG. 7A is a diagram in which a broken line E-E' is added to the configuration illustrated in FIG. 5. FIG. 7B is a graph illustrating an electric field intensity distribution in a section taken along the broken line E-E' in FIG. 7A. In the graph illustrated in FIG. 7B, the one end 403 of the trench structure 307 is located on the side closer to the first surface of the semiconductor substrate 300 than a depth 404 of a maximum electric field intensity at the pn-junction between the first semiconductor region 301 and the second semiconductor region 302. This is because the light emission phenomenon in the high electric field region during avalanche multiplication increases in proportion to the electric field intensity, and the emission intensity is maximized at the depth 404 of the maximum electric field intensity. Accordingly, the one end 403 of the trench structure 307 is formed on the side closer to the first surface than the depth 404 of the maximum electric field intensity, thereby the effect of reducing crosstalk on adjacent pixels can be enhanced. If the depth 404 of the maximum electric field intensity is set on a side closer to the first surface than the one end 403 of the trench structure 307, photons emitted at the depth 404 of the maximum electric field intensity are likely to intrude into adjacent pixels, which causes deterioration in the crosstalk. Accordingly, in terms of reduction in the crosstalk, the one end 403 on the side closer to the first surface of the trench structure 307 is preferably formed on the side closer to the first surface than the depth 404 of the maximum electric field intensity.

In a case where photons generated by light emission in the avalanche multiplication region 310 propagate in the horizontal direction of the semiconductor substrate 300, or propagate toward the second surface of the semiconductor substrate 300, the photons are reflected by the trench structure 307, thereby preventing intrusion of photons into adjacent pixels.

On the other hand, in a case photons generated by light emission in the pn-junction portion pass through the third semiconductor region 306, since the trench structure is not present in this portion, the photons intrude into adjacent pixels and are photoelectrically converted, thereby forming an electron and a hole. However, electrons generated as signal charges mainly pass through the sixth semiconductor region 303 and are absorbed by the first semiconductor region 301. In other words, no signals are read out through the pn-junction surface between the first semiconductor region 301 and the second semiconductor region 302 in which an intense electric field is generated, and thus an avalanche multiplication required for detecting signal charges based on the avalanche diodes does not occur. Accordingly, the signal charges are not counted in adjacent pixels, which leads to a reduction in the crosstalk.

If an electric field concentration region is formed between the first semiconductor region 301 and the third semiconductor region 306, the concentration region becomes a noise deterioration factor. Accordingly, the third semiconductor region 306 is preferably disposed at a central portion of a boundary between pixels. In other words, when the third semiconductor region 306 is disposed between two first semiconductor regions 301, it is preferable to set the same distance between the first semiconductor region 301 and the third semiconductor region 306.

The third semiconductor region 306 is preferably formed only to the depth at which the one end 403 is located. The third semiconductor region 306 is generally formed by ion implantation. The more implantation energy for ion implantation, the more the amount of diffusion in a lateral direction in the substrate. In the case of a structure in which the third semiconductor region 306 is formed to the depth corresponding to the second surface of the semiconductor substrate 300 and contacts the fifth semiconductor region 305, the closer the third semiconductor region 306 is placed to the second surface, the more the width of extension of the third semiconductor region 306 in the lateral direction, and the effective photoelectric conversion region is reduced. In this case, as the size of each pixel decreases, the effect of deterioration in sensitivity increases due to the reduction of the photoelectric conversion region. Therefore, it is preferable to form the third semiconductor region 306 at the same depth as the one end 403 of the trench structure 307.

The third semiconductor region 306 is a region formed to reduce a contact resistance with each contact plug, and may be formed in a region where the interface on the side closer to the first surface of the semiconductor substrate 300 contacts the electrode 402. Accordingly, there is no need to form the third semiconductor region 306 up to the depth corresponding to the second surface of the semiconductor substrate 300.

In order to reduce dark electrons from a side wall portion of the trench structure 307, for example, the trench structure 307 may be formed of a stacked structure including polysilicon and an oxide film, and a potential that induces holes on a side wall of the trench structure 307 may be applied to polysilicon.

FIG. 6 is a sectional view taken along the B-B' in FIG. 3. The configuration illustrated in FIG. 6 differs from the configuration illustrated in FIG. 5 in that the third semiconductor region 306 is not arranged. This is because the third semiconductor region 306 is a region for supplying a potential to the anode of each avalanche diode, and thus there is no need to arrange the third semiconductor region 306 around the periphery of each pixel. As described above, as the first semiconductor region 301 comes closer to the third semiconductor region 306, the electric field concentration region is likely to be formed, which causes an increase in dark current. If the third semiconductor region 306 is arranged around the periphery of the first semiconductor region 301, the distance therebetween in opposite side directions becomes smaller than that in the diagonal direction. As a result, the electric field concentration region is likely to be formed and an increase in dark current is likely to occur.

Accordingly, the third semiconductor region 306 is preferably not formed in the boundary portion between pixels in the opposite side directions, and is preferably arranged only in the boundary portion between pixels in the diagonal direction.

As described above, the one end 403 of the trench structure 307 is preferably formed between the depth corresponding to the contact plug 401 at which the third semiconductor region 306 of the second conductivity type is formed and the depth corresponding to the contact plug 402 at which the second semiconductor region 302 of the second conductivity type is formed. The structure makes it possible to suppress an increase in dark current and reduce the crosstalk between adjacent pixels even when the size of each pixel is reduced.

FIG. 5 illustrates the third semiconductor region 306 that is formed between the first surface and the one end 403 of the trench structure 307. However, the third semiconductor region 306 is not particularly limited to such formation, and the third semiconductor region 306 may be formed to reach a side surface of the trench structure 307.

Next, a method of manufacturing the photoelectric conversion apparatus according to the present exemplary embodiment will be described. While the method of manufacturing the photoelectric conversion apparatus according to the present exemplary embodiment is described for convenience of explanation, photoelectric conversion apparatuses according to other exemplary embodiments can also be produced by the same manufacturing method. With respect to well-known manufacturing methods which can be applied to some of the processes, its illustration is omitted in FIGS. 8A to 8K.

Figure 8A:
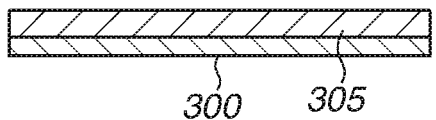
FIGS. 8A to 8K each illustrate a method of manufacturing a photoelectric conversion apparatus according to the first exemplary embodiment.

As illustrated in FIG. 8A, impurities of the second conductivity type are implanted by ion implantation to the region corresponding to the fifth semiconductor region 305, from a direction normal to the first surface of the semiconductor substrate 300. Thus, the fifth semiconductor region 305 is formed at a position deeper than the first surface of the semiconductor substrate 300.

Figure 8B:
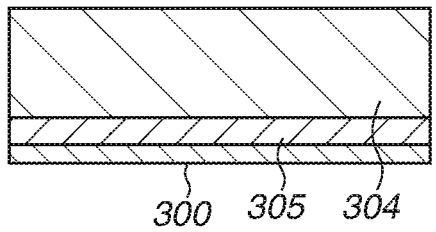

Next, as illustrated in FIG. 8B, impurities of the second conductivity type are implanted by ion implantation from a direction normal to the first surface of the semiconductor substrate 300, thereby forming the fourth semiconductor region 304 at a position shallower than the fifth semiconductor region 305. In this case, the fourth semiconductor region 304 is formed such that the fourth semiconductor region 304 is connected to the fifth semiconductor region 305. In addition, the fourth semiconductor region 304 is formed with an impurity concentration lower than that of the fifth semiconductor region 305.

Figure 8C:
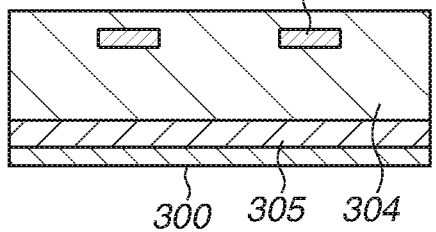

Next, as illustrated in FIG. 8C, the second semiconductor region 302 is formed from the direction normal to the first surface of the semiconductor substrate 300. The second semiconductor region 302 is formed at a position apart from the first surface.

Figure 8D:
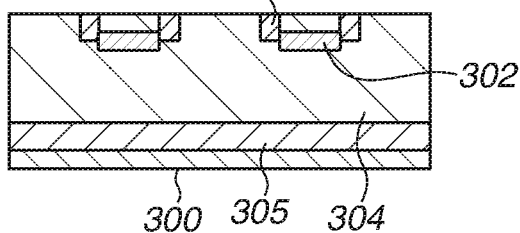

Next, as illustrated in FIG. 8D, the sixth semiconductor region 303 is formed from the direction normal to the first surface of the semiconductor substrate 300. The sixth semiconductor region 303 is formed between the first surface and the second semiconductor region 302.

Figure 8E:
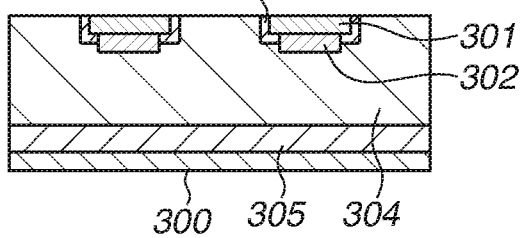

Next, as illustrated in FIG. 8E, the first semiconductor region 301 is formed from the direction normal to the first surface of the semiconductor substrate 300. In this case, the sixth semiconductor region 303 is arranged around the first semiconductor region 301.

Figure 8F:
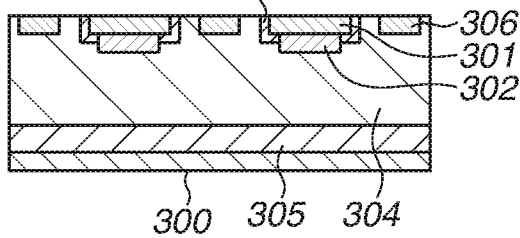

Next, as illustrated in FIG. 8F, the third semiconductor region 306 is formed from the direction normal to the first surface of the semiconductor substrate 300. The third semiconductor region 306 is a region formed to reduce the contact resistance of the contact plug. The third semiconductor region 306 is formed with an impurity concentration higher than that of the fourth semiconductor region 304.

Figure 8G:
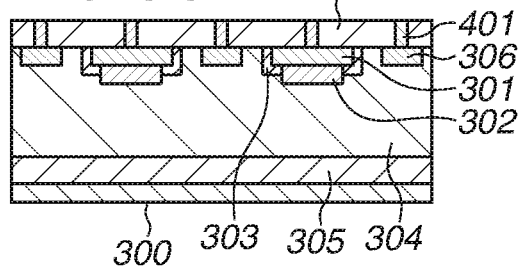

Next, as illustrated in FIG. 8G, an interlayer insulating film 600 and the contact plug 401 are formed. The contact plug 401 is formed to contact one of the first semiconductor region 301 and the third semiconductor region 306.

Figure 8H:
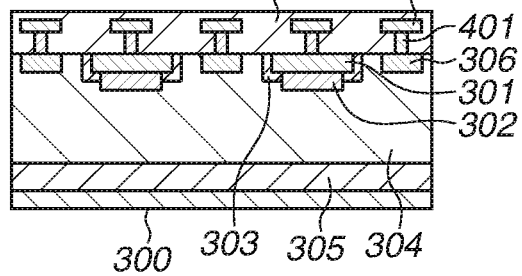

Next, as illustrated in FIG. 8H, a first wiring 602 is formed to cover an upper portion of the contact plug 401.

Figure 8I:
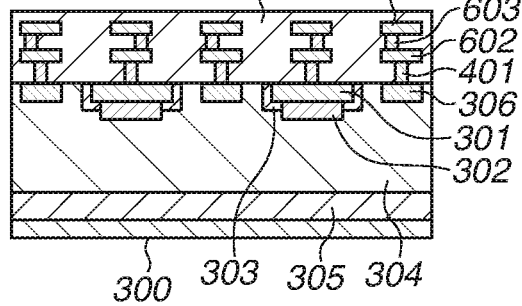

Next, as illustrated in FIG. 8I, a first via 603 is formed and then a second wiring 604 is formed to cover an upper portion of the first via 603.

Figure 8J:
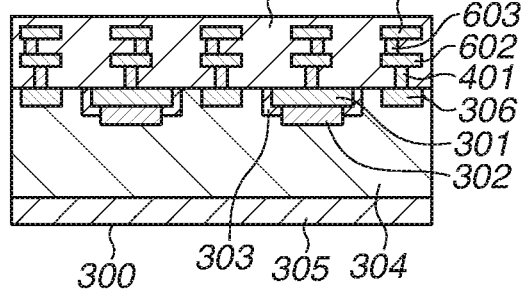

Next, as illustrated in FIG. 8J, the second surface of the semiconductor substrate 300 is polished so that the fifth semiconductor region 305 forms the second surface. In this case, a film (not illustrated) for preventing dark electrons from being generated at the interface on a side of the second surface of the semiconductor substrate 300 may be formed on the second surface of the semiconductor substrate 300 so that the second surface can form the second surface of the semiconductor substrate 300.

Figure 8K:
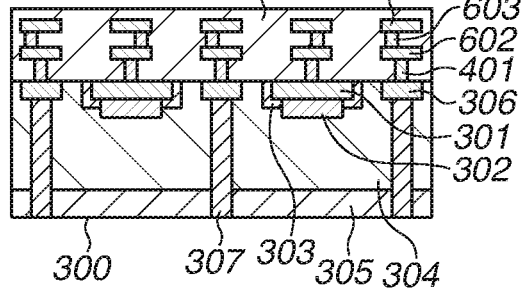

Next, as illustrated in FIG. 8K, the trench structure 307 is formed from a side of the second surface of the semiconductor substrate 300.

The sixth semiconductor region 303 illustrated in FIG. 5 does not necessarily needs to be formed. Even when the sixth semiconductor region 303 is not provided and the fourth semiconductor region 304 is in contact with the first semiconductor region 301, the crosstalk caused by the trench structure can be reduced.

Figure 9:
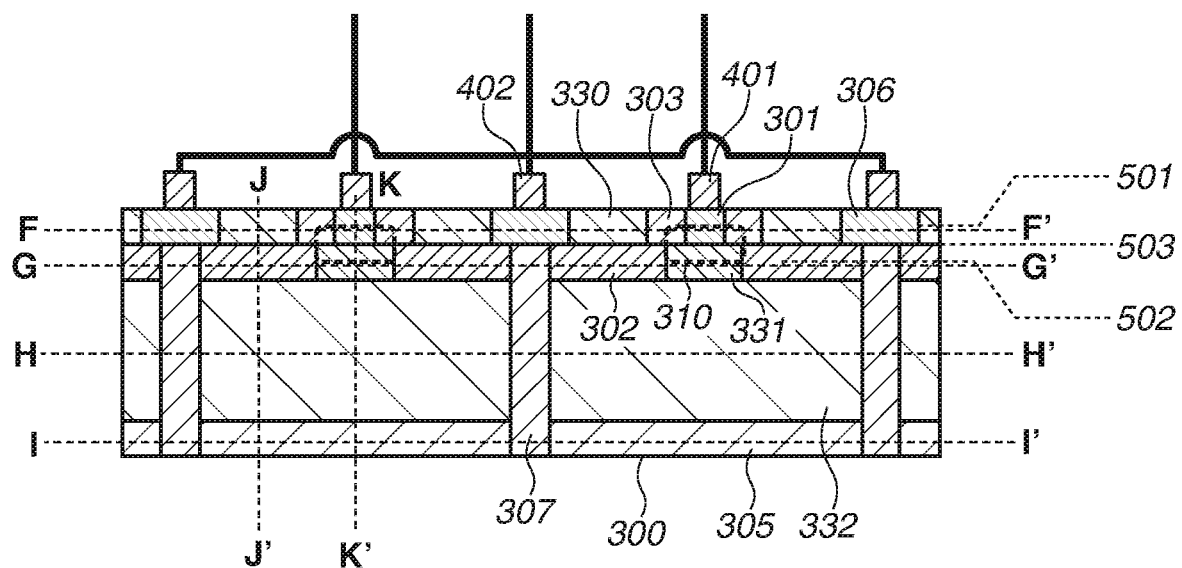
FIG. 9 is a sectional view in a diagonal direction according to a second exemplary embodiment.

A second exemplary embodiment will be described below. FIG. 9 is a sectional view of the second exemplary embodiment. The second exemplary embodiment differs from the first exemplary embodiment in that the semiconductor regions in the semiconductor substrate 300 have different configurations as described below. Components of the second exemplary embodiment that are similar to those of the first exemplary embodiment are denoted by the same reference numerals, and descriptions thereof are omitted or simplified.

At the same depth as the first semiconductor region 301 of the first conductivity type, the sixth semiconductor region 303 of the first conductivity type and a seventh semiconductor region 330 of the first conductivity type are disposed. The first semiconductor region 301 is in contact with the sixth semiconductor region 303, and the sixth semiconductor region 303 is arranged around the first semiconductor region 301 in a plan view. The sixth semiconductor region 303 is in contact with the seventh semiconductor region 330, and the seventh semiconductor region 330 is arranged around the sixth semiconductor region 303 in a plan view.

At a position deeper than the first semiconductor region 301, an eighth semiconductor region 331 which has the first conductivity type and has an impurity concentration lower than that of the first semiconductor region 301 is disposed. The first semiconductor region 301 is in contact with the eighth semiconductor region 331. At the same depth as the eighth semiconductor region 331, the second semiconductor region 302 of the second conductivity type is disposed, and the eighth semiconductor region 331 is in contact with the second semiconductor region 302. The second semiconductor region 302 is arranged around the eighth semiconductor region 331 in a plan view. The sixth semiconductor region 303 overlaps with at least a part of the second semiconductor region 302, and the seventh semiconductor region 330 overlaps with at least a part of the second semiconductor region 302.

Further, the second semiconductor region 302 is arranged between the eighth semiconductor region 331 and the trench structure 307 in a plan view.

At a position deeper than the eighth semiconductor region 331 and the second semiconductor region 302 relative to the first surface, a ninth semiconductor region 332 of the first conductivity type is disposed. The eighth semiconductor region 331 and the second semiconductor region 302 overlap with the ninth semiconductor region 332 in a plan view.

The first semiconductor region 301 is a region with a first-conductivity-type impurity concentration higher than that of the seventh semiconductor region 330, the eighth semiconductor region 331, and the ninth semiconductor region 332. The impurity concentration set as described above makes it possible to strengthen the electric field of the depletion layer generated in the first semiconductor region 301. In the first semiconductor region 301, the third semiconductor region 306 is supplied with a potential as a reverse bias.

Figure 10:
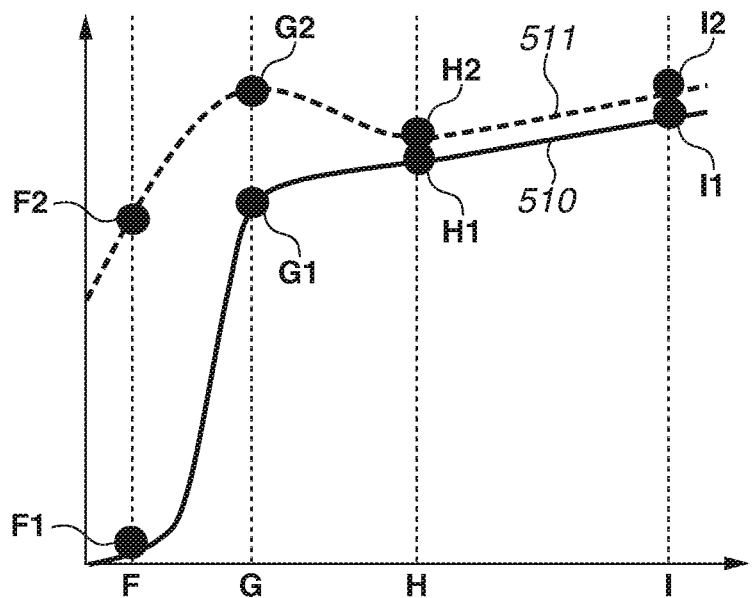
FIG. 10 is a graph illustrating a potential distribution according to the second exemplary embodiment.

Next, a potential distribution illustrated in FIG. 9 will be described with reference to FIG. 10. FIG. 10 is a graph illustrating a potential distribution according to the present exemplary embodiment. A solid line 510 illustrated in FIG. 10 represents a potential distribution in a section taken along a broken line K-K' in FIG. 9. A broken line 511 illustrated in FIG. 10 represents a potential distribution in a section taken along a broken line J-J' in FIG. 9. FIG. 10 illustrates potentials relative to electrons serving as signal charges. When signal charges are holes, the relationship between a high potential and a low potential is reversed. A depth F illustrated in FIG. 10 corresponds to a line F-F' illustrated in FIG. 9. Similarly, a depth G corresponds to a line G-G', a depth H corresponds to a line H-H', and a depth I corresponds to a line I-I'.

In FIG. 10, a potential height of the solid line 510 at the depth F is represented by F1, a potential height of the broken line 511 at the depth F is represented by F2, a potential height of the solid line 510 at the depth G is represented by G1, and a potential height of the broken line 511 at the depth G is represented by G2. Also, a potential height of the solid line 510 at the depth H is represented by H1, a potential height of the broken line 511 at the depth H is represented by H2, a potential height of the solid line 510 at the depth I is represented by I1, and a potential height of the broken line 511 at the depth I is represented by I2.

Figure 11B:
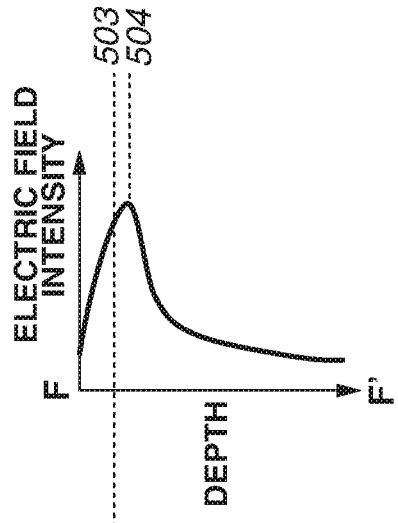
FIGS. 11A and 11B each illustrate an electric field intensity distribution according to the second exemplary embodiment.
Figure 11A:
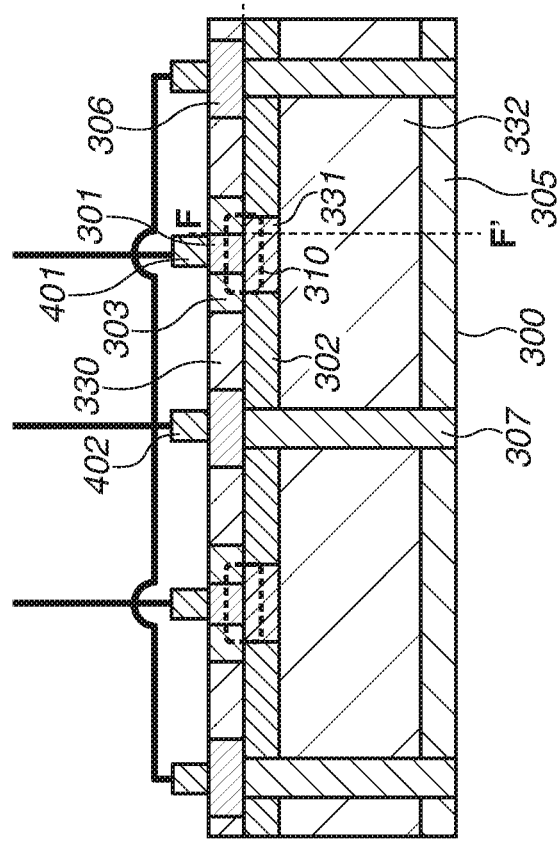

Referring to FIGS. 10, 11A, and 11B, the potential height of the first semiconductor region 301 corresponds to F1, and the potential height of the eighth semiconductor region 331 corresponds to G1. The potential height of the seventh semiconductor region 330 corresponds to F2, and the potential height of the second semiconductor region 302 corresponds to G2.

With this potential structure, electric charges generated in the ninth semiconductor region 332 illustrated in FIG. 9 are collected in the eighth semiconductor region 331 having a potential lower than that of the second semiconductor region 302. Electric charges generated in the ninth semiconductor region 332 illustrated in FIG. 9 are multiplied by avalanche multiplication in the avalanche multiplication region 310 and are counted as signal charges.

In the configuration illustrated in FIG. 9, an end of the trench structure 307 on a side of the first surface of the semiconductor substrate 300 is preferably located on a side closer to the first surface than the avalanche multiplication region 310, and is preferably located on a side closer to the first surface than the second semiconductor region 302. With the configuration, the crosstalk can be reduced.

Next, a distribution of electric field intensity according to the present exemplary embodiment will be described with reference to FIGS. 11A and 11B. FIG. 11B is a graph illustrating a distribution of electric field intensity in a section indicated by the broken line F-F' in FIG. 11A. In the graph illustrated in FIG. 11B, a first-surface-side end 503 of the semiconductor substrate 300 of the trench structure 307 is preferably located on a side closer to the first surface of the semiconductor substrate 300 than a depth 504 of a maximum electric field intensity. This is because, as described above in the first exemplary embodiment, the light emission phenomenon in the high electric field region during avalanche multiplication increases in proportion to the electric field intensity, and the emission intensity is maximized at the depth 504 of the maximum electric field intensity. Accordingly, the first-surface-side end 503 of the trench structure 307 is formed on the side closer to the first surface than the depth 504 of the maximum electric field intensity, thereby making it possible to enhance the effect of reducing the crosstalk between adjacent pixels. If the depth 504 of the maximum electric field intensity is set on the side closer to the first surface than the first-surface-side end 503 of the trench structure 307, photons emitted at the depth 504 of the maximum electric field intensity are likely to intrude into adjacent pixels, which causes deterioration in the crosstalk. Therefore, in terms of reduction in the crosstalk, the first-surface-side end 503 of the trench structure 307 is preferably formed on the side closer to the first surface than the depth 504 of the maximum electric field intensity.

According to the structure of the present exemplary embodiment, like in the first exemplary embodiment, it is possible to reduce the size of each pixel and reduce the crosstalk while suppressing an increase in dark current due to electric field concentration. Further, as compared with the first exemplary embodiment, signal charges can be more easily collected in the avalanche multiplication region 310 while the sensitivity region is secured. Even if photons which have passed through the third semiconductor region 306 are photoelectrically converted in adjacent pixels and the signal charges will propagate to the ninth semiconductor region 32, the second semiconductor region 302 becomes a potential barrier. Accordingly, the signal charges are prevented from intruding into the ninth semiconductor region 332 and thus the crosstalk can be more easily reduced than in the first exemplary embodiment.

Figure 12:
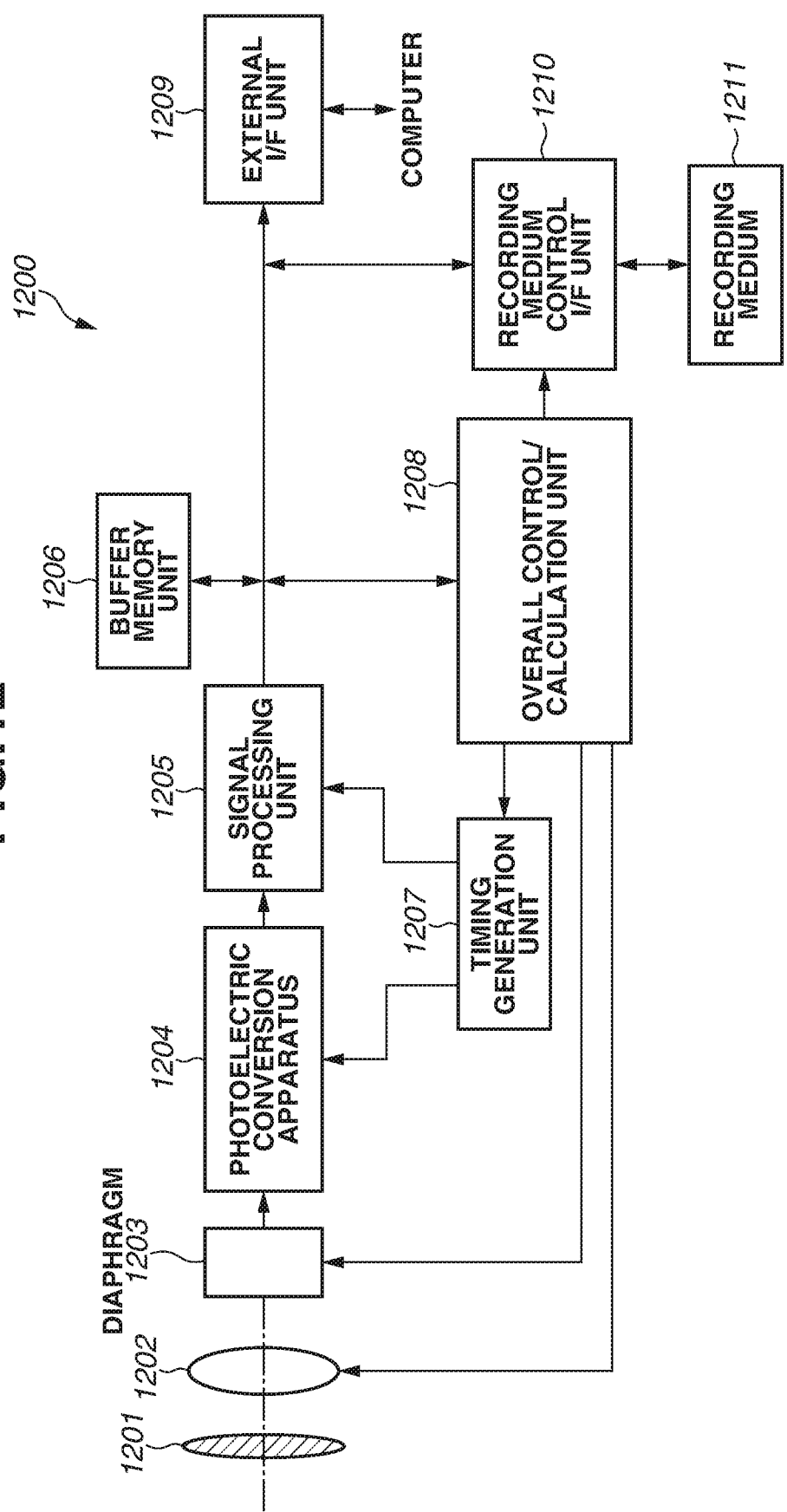
FIG. 12 is a block diagram illustrating a schematic configuration of a photoelectric conversion system according to a third exemplary embodiment.

A third exemplary embodiment will be described below. FIG. 12 is a block diagram illustrating a configuration of a photoelectric conversion system 1200 according to the third exemplary embodiment. The photoelectric conversion system 1200 according to the third exemplary embodiment includes a photoelectric conversion apparatus 1204. In this case, any one of the photoelectric conversion apparatuses described in the exemplary embodiments described above can be applied to the photoelectric conversion apparatus 1204. The photoelectric conversion system 1200 can be used as, for example, an image capturing system. Specific examples of the image capturing system include a digital still camera, a digital camcorder, and a monitoring camera. FIG. 12 illustrates an example where a digital still camera is used as the photoelectric conversion system 1200.

The photoelectric conversion system 1200 illustrated in FIG. 12 includes the photoelectric conversion apparatus 1204, a lens 1202 that focuses an optical image of an object on the photoelectric conversion apparatus 1204, a diaphragm 1203 for varying the amount of light passing through the lens 1202, and a barrier 1201 for protecting the lens 1202. The lens 1202 and the diaphragm 1203 are optical systems that condense light onto the photoelectric conversion apparatus 1204.

The photoelectric conversion system 1200 further includes a signal processing unit 1205 that performs processing on output signals output from the photoelectric conversion apparatus 1204. The signal processing unit 1205 performs a signal processing operation for performing various correction and compression processes on an input signal, as needed, and outputs the processed signal. The photoelectric conversion system 1200 further includes a buffer memory unit 1206 for temporarily storing image data, and an external interface unit (external I/F unit) 1209 for communicating with an external computer or the like. The photoelectric conversion system 1200 further includes a recording medium 1211, such as a semiconductor memory for recording or reading captured image data, and a recording medium control interface unit (recording medium control I/F unit) 1210 for recording or reading data on or from the recording medium 1211. The recording medium 1211 may be incorporated in the photoelectric conversion system 1200, or may be detachably mounted on the photoelectric conversion system 1200. Communication with the recording medium 1211 from the recording medium control I/F unit 1210 and communication from the external I/F unit 1209 may be carried out by a wireless connection.

The photoelectric conversion system 1200 further includes an overall control/calculation unit 1208 that performs various calculations and controls the overall operation of the digital still camera, and a timing generation unit 1207 that outputs various timing signals to each of the photoelectric conversion apparatus 1204 and the signal processing unit 1205. In this case, the timing signals and the like may be input from the outside of the photoelectric conversion system 1200, and the photoelectric conversion system 1200 may include at least the photoelectric conversion apparatus 1204 and the signal processing unit 1205 that processes output signals output from the photoelectric conversion apparatus 1204. As described above in the third exemplary embodiment, the timing generation unit 1207 may be mounted on the photoelectric conversion apparatus 1204. The overall control/calculation unit 1208 and the timing generation unit 1207 may be configured to execute some or all of control functions of the photoelectric conversion apparatus 1204.

The photoelectric conversion apparatus 1204 outputs an image signal to the signal processing unit 1205. The signal processing unit 1205 executes predetermined signal processing on the image signal output from the photoelectric conversion apparatus 1204, and outputs image data. Further, the signal processing unit 1205 generates an image by using the image signal. Further, the signal processing unit 1205 may perform a ranging calculation on the signal output from the photoelectric conversion apparatus 1204. The signal processing unit 1205 and the timing generation unit 1207 may be mounted on the photoelectric conversion apparatus 1204. In other words, the signal processing unit 1205 and the timing generation unit 1207 may be provided on a substrate on which pixels are arranged, or may be provided on another substrate. The image capturing system is configured using any one of the photoelectric conversion apparatuses according to the exemplary embodiments described above, thereby making it possible to implement the image capturing system capable of acquiring an image with a high quality.

A photoelectric conversion system and a moving body according to a fourth exemplary embodiment will be described with reference to FIGS. 13A and 13B and FIG. 14.

Figure 13A:
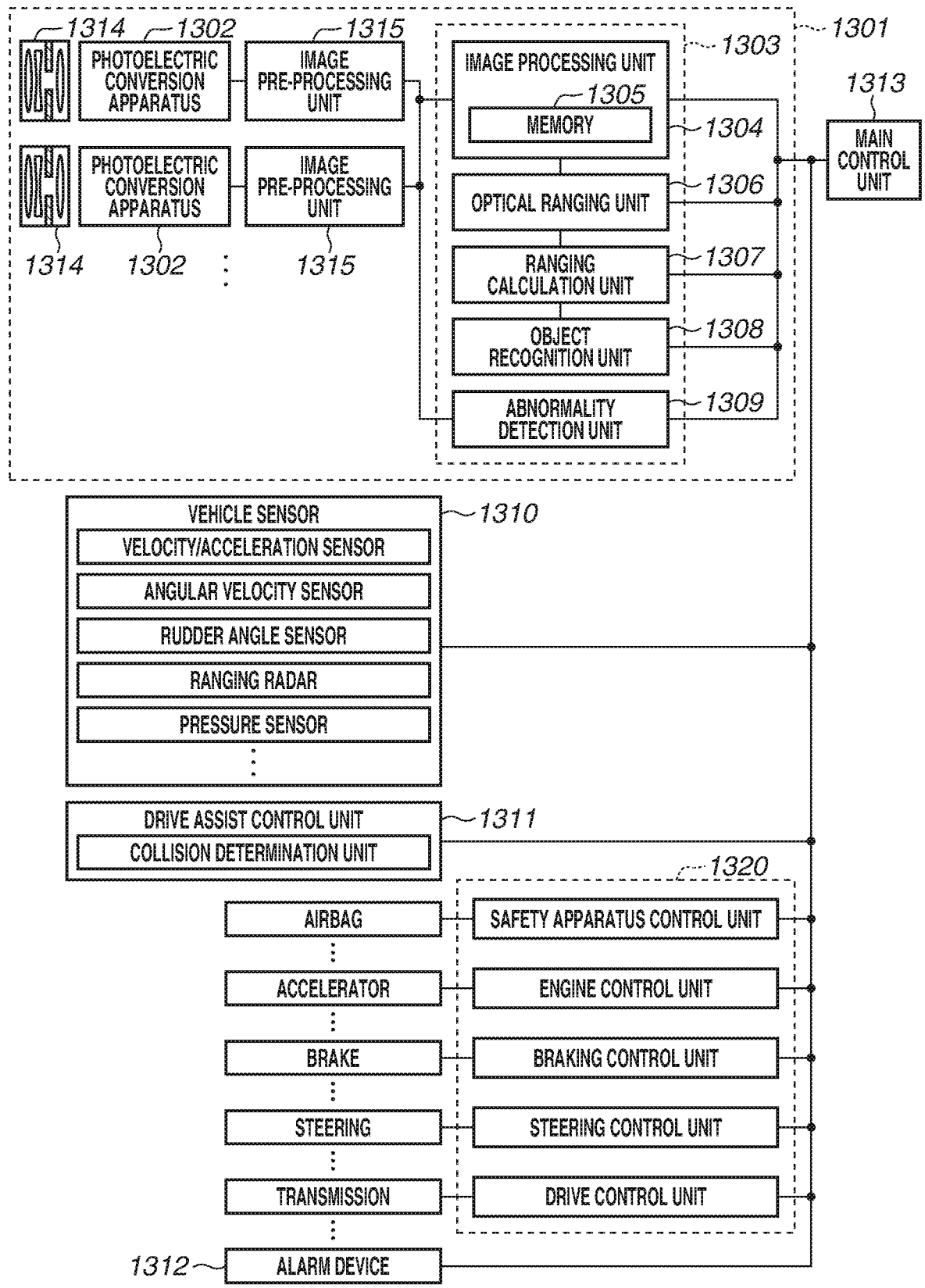
FIG. 13A is a block diagram schematically illustrating a configuration example of a photoelectric conversion system according to a fourth exemplary embodiment.
Figure 13B:
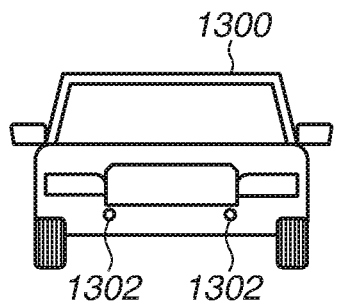
FIG. 13B is a schematic view illustrating a configuration example of a moving body according to the fourth exemplary embodiment.
Figure 13B:
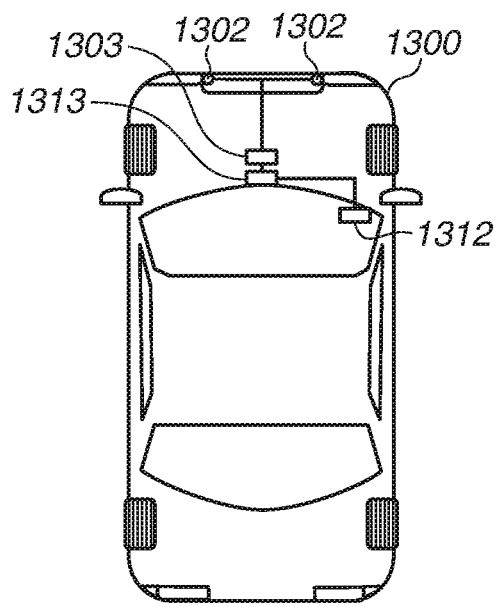
Figure 13B:
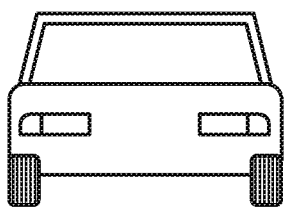
Figure 14:
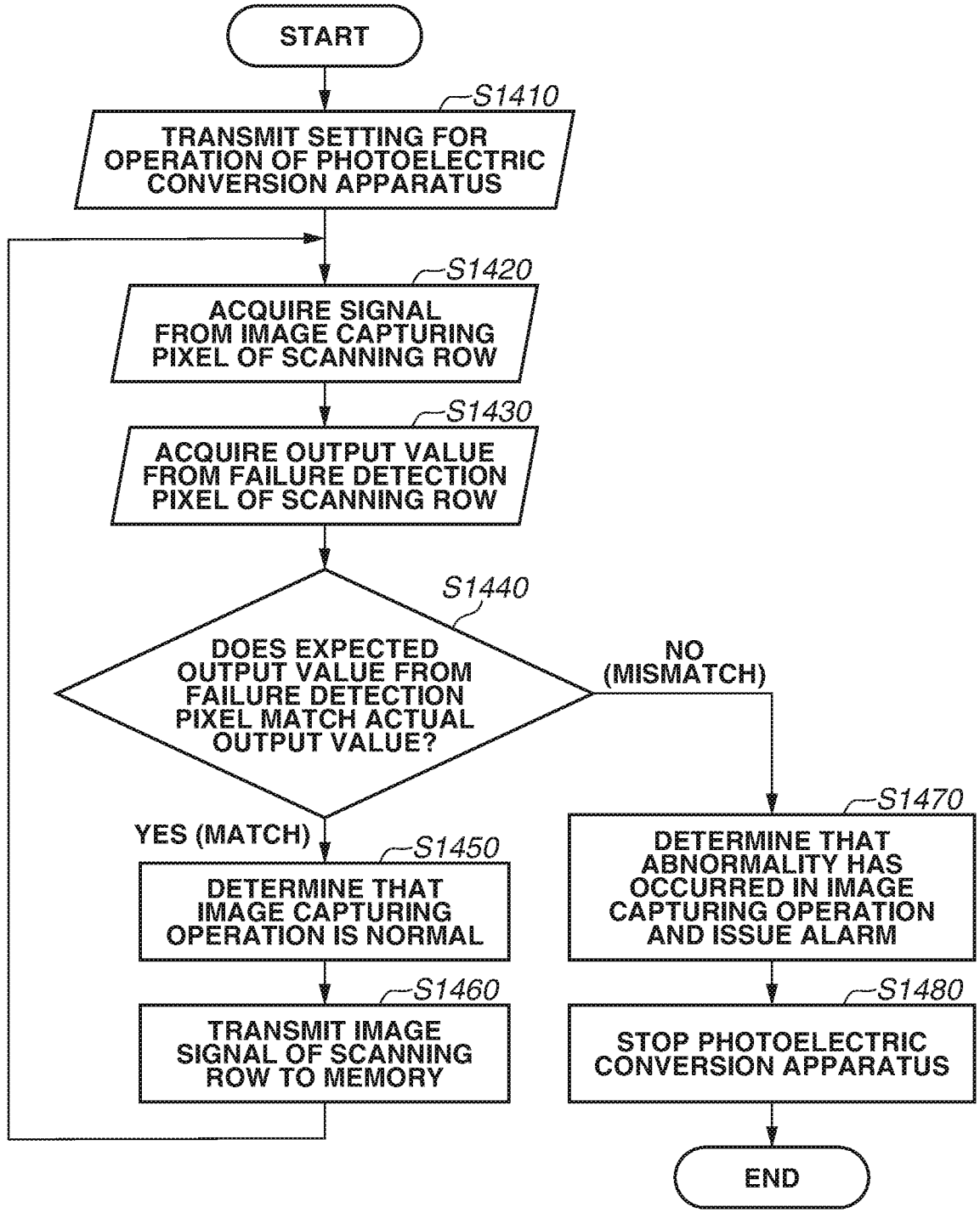
FIG. 14 is a flowchart illustrating an operation to be performed by the photoelectric conversion system according to the fourth exemplary embodiment.

FIG. 13A is a block diagram schematically illustrating a configuration example of the photoelectric conversion system according to the present exemplary embodiment, and FIG. 13B is a schematic view illustrating a configuration example of the moving body according to the present exemplary embodiment. FIG. 14 is a flowchart illustrating an operation to be performed by the photoelectric conversion system according to the present exemplary embodiment. The present exemplary embodiment illustrates an example where an in-vehicle camera is used as the photoelectric conversion system.

FIGS. 13A and 13B each illustrate a configuration example of a vehicle system and a photoelectric conversion system for image capturing that is mounted on the vehicle system. A photoelectric conversion system 1301 includes photoelectric conversion apparatuses 1302, image pre-processing units 1315, an integrated circuit 1303, and optical systems 1314. Each optical system 1314 forms an optical image of an object on each photoelectric conversion apparatus 1302. Each photoelectric conversion apparatus 1302 converts the optical image of the object formed by each optical system 1314 into an electric signal. The photoelectric conversion apparatus 1302 is any one of the photoelectric conversion apparatuses according to the exemplary embodiments described above. The image pre-processing unit 1315 performs predetermined signal processing on the signal output from each photoelectric conversion apparatus 1302. A function of the image pre-processing unit 1315 may be incorporated in each photoelectric conversion apparatus 1302. The photoelectric conversion system 1301 is provided with at least two sets of the optical system 1314, the photoelectric conversion apparatus 1302, and the image pre-processing unit 1315, and the output from each set of the image pre-processing units 1315 is input to the integrated circuit 1303.

The integrated circuit 1303 is a circuit for the image capturing system, and includes an image processing unit 1304 including a memory 1305, an optical ranging unit 1306, a ranging calculation unit 1307, an object recognition unit 1308, and an abnormality detection unit 1309. The image processing unit 1304 performs image processing, such as development processing or defect correction processing, on the output signal from each image pre-processing unit 1315. The memory 1305 primarily stores a captured image and stores a defect position in an image capturing pixel. The optical ranging unit 1306 performs focusing of an object and ranging. The ranging calculation unit 1307 calculates ranging information from a plural pieces of image data acquired by the photoelectric conversion apparatuses 1302. The object recognition unit 1308 recognizes objects such as a vehicle, a road, a sign, and a person. Upon detecting an abnormality in the photoelectric conversion apparatuses 1302, the abnormality detection unit 1309 issues an alarm to a main control unit 1313 to notify that an abnormality has occurred.

The integrated circuit 1303 may be implemented by hardware designed for exclusive use, by a software module, or may be implemented by a combination thereof. Further, the integrated circuit 1303 may be implemented by a field programmable gate array (FPGA), an application specific integrated circuit (ASIC), or the like, or a combination thereof.

The main control unit 1313 controls the operations of the photoelectric conversion system 1301, a vehicle sensor 1310, a control unit 1320, and the like in an integrated manner. The main control unit 1313 may be omitted, and each of the photoelectric conversion system 1301, the vehicle sensor 1310, and the control unit 1320 may include a communication interface to transmit or receive a control signal via a communication network (for example, controller area network (CAN) standards).

The integrated circuit 1303 includes a function of receiving a control signal from the main control unit 1313, or transmitting a control signal and a setting value to each photoelectric conversion apparatus 1302 by a control unit of the integrated circuit 1303.

The photoelectric conversion system 1301 is connected to the vehicle sensor 1310, and can detect a travelling state of the vehicle, such as a vehicle speed, a yaw rate, and a rudder angle, a vehicle external environment, and states of other vehicles and obstacles. The vehicle sensor 1310 is also a distance information acquisition unit that acquires information about a distance to a target object. Further, the photoelectric conversion system 1301 is connected to a drive assist control unit 1311 that performs various drive assist operations such as automatic steering, automatic cruising, and collision prevention functions. In particular, as for a collision determination function, it is estimated whether a collision with other vehicles or obstacles may occur, or it is determined whether a collision with other vehicles or obstacles has occurred based on detection results from the photoelectric conversion system 1301 and the vehicle sensor 1310. Thus, an accident avoidance control is performed when it is estimated that a collision may occur, or a safety apparatus is activated when it is determined that a collision has occurred.

Further, the photoelectric conversion system 1301 is also connected to an alarm device 1312, which issues an alarm to a driver, based on the determination result from a collision determination unit. For example, if it is highly likely that a collision may occur based on the result of determination by the collision determination unit, the main control unit 1313 performs vehicle control for avoiding a collision or reducing a damage by, for example, applying a brake, returning an accelerator, or suppressing an engine output. The alarm device 1312 issues an alarm to a user by, for example, issuing an alarm such as sound, displaying alarm information on a screen of a car navigation system or a meter panel, or applying a vibration to a seat belt or a steering wheel.

In the present exemplary embodiment, the photoelectric conversion system 1301 captures an image of the periphery of the vehicle, for example, the front or the back of the vehicle. FIG. 13B illustrates an example where the photoelectric conversion system 1301 is arranged in a case where an image of a front portion of the vehicle is captured by the photoelectric conversion system 1301.

Two photoelectric conversion apparatuses 1302 are provided at the front side of a vehicle 1300. Specifically, assuming that a central line with respect to an advancing/receding direction of the vehicle 1300 or the contour of the vehicle 1300 (for example, the width of the vehicle) is regarded as a symmetric axis, the two photoelectric conversion apparatuses 1302 are preferably provided to be symmetric to an axis of symmetry to acquire information about a distance between the vehicle 1300 and a target object and determine the possibility of occurrence of a collision. Further, the photoelectric conversion apparatuses 1302 are preferably disposed at a position where the driver's field of view is not inhibited when an outside state of the vehicle 1300 is visually observed by the driver from a driver's seat. The alarm device 1312 is preferably disposed at a position where the alarm device 1312 can easily come into the driver's sight.

Next, a failure detection operation of each photoelectric conversion apparatus 1302 in the photoelectric conversion system 1301 will be described with reference to FIG. 14. The failure detection operation of each photoelectric conversion apparatus 1302 is carried out in accordance with steps S1410 to S1480 illustrated in FIG. 14.

In step S1410, a setting is made to start up the photoelectric conversion apparatus 1302. Specifically, the setting for the operation of the photoelectric conversion apparatus 1302 is transmitted from the outside (for example, the main control unit 1313) of the photoelectric conversion system 1301 or from the inside of the photoelectric conversion system 1301 to start the image capturing operation and failure detection operation of the photoelectric conversion apparatus 1302.

Next, in step S1420, a pixel signal is acquired from an effective pixel. In step S1430, an output value from a failure detection pixel provided for failure detection is acquired. The failure detection pixel includes a photoelectric conversion unit, similar to an effective pixel. A predetermined voltage is written into the photoelectric conversion unit. The failure detection pixel outputs a signal corresponding to the voltage written into the photoelectric conversion unit. Steps S1420 and S1430 may be reversed.

Next, in step S1440, it is determined whether an expected output value from the failure detection pixel matches an actual output value from the failure detection pixel. As a result of determination in step S1440, if the expected output value matches the actual output value (YES in step S1440), the processing proceeds to step S1450. In step S1450, it is determined that the image capturing operation is normally performed, and the processing proceeds to step S1460. In step S1460, a pixel signal in a scanning row is transmitted to the memory 1305 and is primarily stored in the memory 1305. After that, the processing returns to step S1420 to continue the failure detection operation. On the other hand, as a result of determination in step S1440, if the expected output value does not match the actual output value (NO in step S1440), the processing proceeds to step S1470. In step S1470, it is determined that an abnormality has occurred in the image capturing operation, and an alarm is issued to the main control unit 1313 or the alarm device 1312. The alarm device 1312 causes the display unit to display information indicating that an abnormality has been detected. After that, in step S1480, the photoelectric conversion apparatus 1302 is stopped to terminate the operation of the photoelectric conversion system 1301.

While the present exemplary embodiment illustrates an example where the flowchart is looped for each row, the flowchart may be looped for a plurality of rows, or the failure detection operation may be performed for each frame. In step S1470, an alarm may be issued to send a notification to the outside of the vehicle through a wireless network.

While the present exemplary embodiment described above illustrates an example of a control operation for preventing the vehicle from colliding with another vehicle, the present exemplary embodiment can also be applied to, for example, a control operation for automatic driving by following another vehicle, and a control operation for automatic driving to prevent the vehicle from deviating from a lane. Further, the photoelectric conversion system 1301 is not limited to a vehicle such as an own car on which the photoelectric conversion system 1301 is mounted, but can be applied to, for example, a moving body (mobile apparatus) such as a ship, an aircraft, or an industrial robot. In addition, the present disclosure is not limited to the moving body, but can be applied to devices that widely use object recognition, such as an intelligent transportation system (ITS).

A photoelectric conversion apparatus according to an aspect of the present disclosure may be configured to acquire various information such as distance information.

The present disclosure is not limited to the exemplary embodiments described above and can be modified in various ways. For example, an example where some of the components described in any one of the exemplary embodiments are added to another exemplary embodiment, or an example where some of the components are replaced by components of another exemplary embodiment can also be included in exemplary embodiments of the present disclosure.

The exemplary embodiments described above merely illustrate examples for carrying out the present disclosure, and the technical scope of the present disclosure should not be interpreted in a limitative manner by the exemplary embodiments. That is, the present disclosure can be carried out in various forms without departing from the technical idea of the disclosure or the principal features of the disclosure.

According to an aspect of the present disclosure, it is possible to reduce crosstalk between adjacent avalanche diodes and reduce the size of each pixel while suppressing an increase in dark current in a photoelectric conversion apparatus using avalanche diodes.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-153101, filed Aug. 23, 2019, which is hereby incorporated by reference herein in its entirety.

What is claimed is:

1. A photoelectric conversion apparatus comprising:
   a semiconductor substrate including a first surface and a second surface that faces the first surface;
   a plurality of avalanche diodes formed within the semiconductor substrate, and including a first avalanche diode and a second avalanche diode;
   a wiring structure including a contact plug and an interlayer insulating film and formed on the first surface; and
   a trench structure including a material different from a material of the semiconductor substrate and formed between the first avalanche diode and the second avalanche diode adjacent to the first avalanche diode in a plan view,
   wherein each of the plurality of avalanche diodes includes a first semiconductor region of a first conductivity type formed at a first depth with respect to the first surface, and a second semiconductor region of a second conductivity type formed at a second depth with respect to the first surface, the second depth being deeper than the first depth,
   wherein the contact plug is configured to supply a potential to the second semiconductor region of the first avalanche diode,
   wherein the contact plug overlaps with the trench structure in a plan view, and
   wherein the trench structure extends from the second surface to a position between the first surface and the second surface.

2. The photoelectric conversion apparatus according to claim 1, wherein the contact plug further supplies a potential to the second semiconductor region of the second avalanche diode.

3. The photoelectric conversion apparatus according to claim 2,
   wherein the trench structure is formed from the second surface up to the same depth as an avalanche multiplication region of the plurality of avalanche diodes.

4. The photoelectric conversion apparatus according to claim 1,
   wherein each of the plurality of avalanche diodes includes a semiconductor region of the first conductivity type formed at the second depth and having an impurity concentration lower than an impurity concentration of the first semiconductor region, and
   wherein the trench structure is formed from the second surface up to the same depth as an interface between the first semiconductor region and the semiconductor region.

5. The photoelectric conversion apparatus according to claim 1,
   wherein the trench structure is formed from the second surface up to the same depth as an interface between the first semiconductor region and the second semiconductor region.

6. The photoelectric conversion apparatus according to claim 1, wherein a third semiconductor region of the second conductivity type is formed between the contact plug and the trench structure, and
   wherein the third semiconductor region overlaps with the contact plug and the trench structure in the plan view.

7. The photoelectric conversion apparatus according to claim 6, wherein a width of the trench structure is smaller than a width of the third semiconductor region in a plan view.

8. The photoelectric conversion apparatus according to claim 1, wherein the trench structure includes at least one of metal and an insulating member.

9. The photoelectric conversion apparatus according to claim 8, wherein the trench structure is formed around the first semiconductor region in a plan view.

10. The photoelectric conversion apparatus according to claim 1,
    wherein the trench structure includes a first portion extending in a first direction in a plan view and a second portion extending in a second direction intersecting the first direction in a plan view, and
    wherein the contact plug is disposed at an intersection between the first portion and the second portion of the trench structure.

11. The photoelectric conversion apparatus according to claim 1,
    wherein the plurality of avalanche diodes includes a third avalanche diode and a fourth avalanche diode,
    wherein the plurality of avalanche diodes is two-dimensionally arranged, and
    wherein the contact plug supplies a potential to the second semiconductor region of the third avalanche diode and the second semiconductor region of the fourth avalanche diode.

12. The photoelectric conversion apparatus according to claim 1, further comprising a counter circuit configured to perform counting based on a variation in potential at a cathode of the plurality of avalanche diodes.

13. A photoelectric conversion system comprising:
a photoelectric conversion apparatus according to claim 1; and
a signal processing unit configured to process a signal output from the photoelectric conversion apparatus.

14. A moving body comprising:
a photoelectric conversion apparatus according to claim 1; and
a distance information acquisition unit configured to acquire distance information about a distance to a target object from ranging information based on a signal output from the photoelectric conversion apparatus,
wherein the moving body further comprises a control unit configured to control the moving body based on the distance information.

* * * * *